United States Patent [19]
Leung

[11] Patent Number: 6,028,804
[45] Date of Patent: Feb. 22, 2000

[54] METHOD AND APPARATUS FOR 1-T SRAM COMPATIBLE MEMORY

[75] Inventor: Wingyu Leung, Cupertino, Calif.

[73] Assignee: Monolithic System Technology, Inc., Sunnyvale, Calif.

[21] Appl. No.: 09/037,396

[22] Filed: Mar. 9, 1998

[51] Int. Cl.[7] .................................................... G11C 7/00
[52] U.S. Cl. .......................................... 365/222; 365/195
[58] Field of Search ..................................... 365/222, 195

[56] References Cited

U.S. PATENT DOCUMENTS

| | | | |
|---|---|---|---|
| 4,549,284 | 10/1985 | Ikuzaki . | |
| 4,625,301 | 11/1986 | Berger | 365/222 |
| 5,511,033 | 4/1996 | Jung | 365/222 |
| 5,544,120 | 8/1996 | Kuwagata et al. . | |
| 5,586,287 | 12/1996 | Okumura et al. . | |

FOREIGN PATENT DOCUMENTS 0 588 250 A2   3/1994   European Pat. Off. .

Primary Examiner—David Nelms
Assistant Examiner—M. Tran
Attorney, Agent, or Firm—The Law Offices of Bever, Hoffman & Harms, LLP

[57] ABSTRACT

A method and apparatus for handling the refresh of a DRAM array so that the refresh has no effect on the external access. This allows an SRAM compatible memory to be built from DRAM (or 1-Transistor) cells. By utilizing the unused external access time for performing the infrequent memory refresh, there is no penalty on the peak bandwidth requirement of the memory array.

15 Claims, 3 Drawing Sheets

METHOD AND APPARATUS FOR 1-T SRAM COMPATIBLE MEMORY

FIELD OF THE INVENTION

This invention relates to semiconductor memory. In particular, it relates to both SRAM and DRAM, and to using DRAM cells for building SRAM compatible memory.

DESCRIPTION OF PRIOR ART

A conventional DRAM (dynamic random access memory) memory cell consisting of one transistor ("1-T") and one capacitor is significantly smaller, in terms of chip surface area, and hence less expensive than an SRAM (static random access memory) cell which conventionally consists of 4 to 6 transistors. However, data stored in the DRAM cell requires periodic refresh, which is not required in the SRAM cell. Prior art, for example "pseudo-SRAM" (See Toshiba Corp. Data Book, 1990) attempted to use DRAM cell for SRAM applications with little success, because the device required an external signal for controlling memory refresh and during memory refresh, external access is delayed. As a result the refresh is not transparent and the device is inherently not compatible with any SRAM device.

SUMMARY

A single transistor memory cell in accordance with this invention is essentially the same as a conventional DRAM cell. The memory cell thus requires periodic refresh. The refresh takes up memory bandwidth. In general, if the total bandwidth required by both the refresh and external access is smaller than or equal to the memory bandwidth afforded by the memory cell array, memory refresh can be satisfied with no impact (in terms of timing) on the external access. Refresh is a relatively infrequent event, so the average bandwidth that it occupies is relatively small compared to the peak bandwidth available to the memory array. For example, for one embodiment of the invention the memory operating frequency is 100 MHz, and the refresh frequency of 62.5 KHz (for 1000 rows of memory cells and 16 ms refresh time for each row) occupies only 0.0625% of the total available bandwidth.

Theoretically, if the external access frequency is 99.9375 MHz, then the refresh should have no impact on the external access. In practice, however, if the cycle time of the memory array is 10 ns, each occurrence of refresh access takes 10 ns and each external access takes at least 10 ns. In order to make the refresh transparent to external access, the external access time should take no less than 20 ns (10 ns for refresh and 10 ns for actual access), or the external access frequency should be less than 50 MHz. To use a 100 MHz memory array to support a 50 MHz application just to perform the refresh, which has a frequency of 62.5 KHz, is not economical. Furthermore, the average frequency of external access is in general smaller than the peak access frequency. In fact, very few memory systems in the real world can have a utilization factor (average frequency/peak frequency) of greater than 99.9%. Therefore, it is possible to design a memory system, using a 1-T cell, which has a peak operation frequency equal to or slightly greater than the peak external access frequency and which can take advantage of the lower average access frequency to perform memory refresh so that the memory system appears to the outside world like an SRAM.

DETAILED DESCRIPTION

Figures 1, 4:
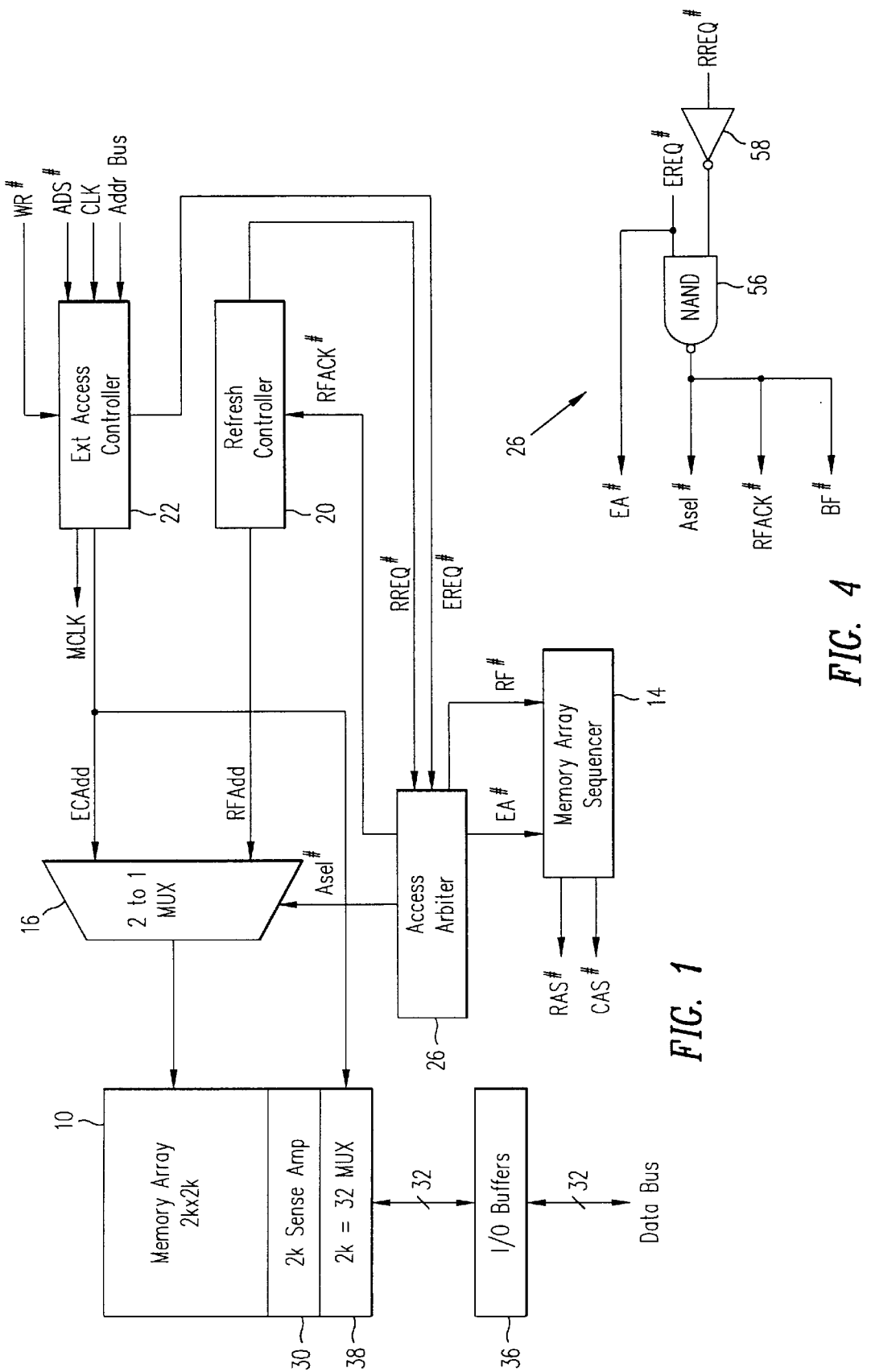
FIG. 1 shows a block diagram of a memory system in accordance with the invention.
FIG. 4 shows the arbiter of FIG. 1.

In one embodiment of the invention, a memory cell array contains 128K words of 32-bits. The array therefore has 32 data I/O lines. FIG. 1 shows an example of the present memory system with such an array. It includes the memory cell array 10, a memory array sequencer 14, a memory address multiplexer 16, a refresh controller 20, an external access controller 22 and an access arbiter 26. The memory array 10 is arranged into 2K rows and 2K columns. Associated with each column is a sense-amplifier in block 30 which performs the data sensing, restore and write operation. During each access, one cell array row is activated and the 2K memory cells of that row are connected to the sense-amplifiers 30 in each column.

The sense-amplifiers 30 are conventionally connected to the I/O buffers 36 through a set of 2K-to-32 column multiplexers 38. The memory array sequencer 14 generates the conventional DRAM control signals RAS# and CAS# for controlling the operation of the array. Functions of the RAS# and CAS# signals are similar to those described in U.S. Pat. No. 5,615,169 to the same inventor, and incorporated by reference herein in its entirety. The external access controller 22 interprets external access commands and generates read/write requests. In one embodiment, two signals are used to determine an external access: Clock (CLK), and Address-Strobe (ADS#). The external access is detected at the rising clock edge on the activation of an Address-Strobe (ADS#) signal.

Figure 2:
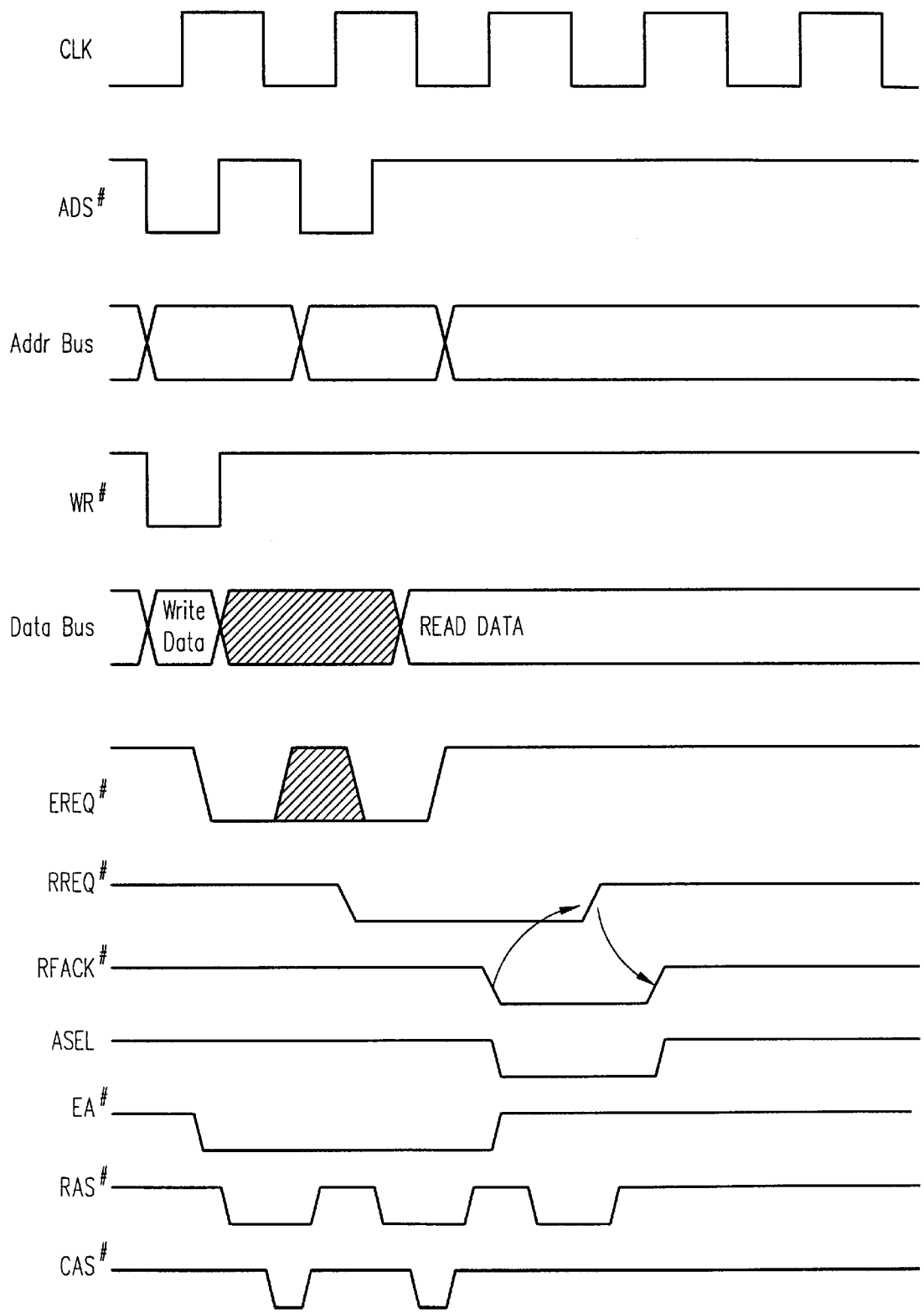
FIG. 2 shows timing for the FIG. 1 system.

FIG. 2 shows the timing relationship of these two signals. The ADS# and CLK signaling is similar to the industry standard for synchronous SRAM (See e.g. *Pentium Processor 3.3v Pipelined BSRAM specification version* 2.0 May 25, 1995, Intel).

In another embodiment, the external interface signal can be made similar to that of standard asynchronous SRAM (See Data sheet for M5M5178P, 64K SRAM, *Mitsubishi Semiconductor Memory Data Book,* 1990). In this case, the ADS# signal can be generated internally by an address transition detection circuit similar to the one described in "A 21-mW 4-Mb CMOS SRAM for Battery Operation" by Murakami et al., JSSC, Vol. 26, No. 11, pp. 1563–1567, November 1991. The ADS# signal thus generated can be used to synchronize the internal operation of the memory.

Upon the detection of an external access, the external-access controller 22 activates the request signal EREQ# to the access arbiter 26 which in turn drives the ASEL signal high to select an address on the External Access Address Bus ECAdd for the accessing address to the memory array 10. Arbiter 26 also activates the External Access EA# signal which is input to the memory array sequencer 14 for generating the RAS# and CAS# signals for controlling the array operations. The timing of these signals is also shown in FIG. 2.

In case of a conflict of access between external and refresh, the access priority is always granted by arbiter 26 to the external access. By doing so, external accesses are not delayed by the refresh. This embodiment is configured to have the memory cycle time equal to a clock period, thus allowing a random access per clock cycle. The access is random, that is, it can be any address spanned by the device address space. At the beginning of a clock cycle, the arbiter 26 evaluates the requests and drives the ASEL signal, input to the address multiplexer 16, to select one of the two addresses: refresh address RFAdd or external access address ECAdd to be used for the memory array 10 operation. Only in the absence of an external access does the arbiter 26 allow a refresh access to go through. In case of collisions, the refresh is delayed. The timing of this is also shown in FIG. 2.

The refresh controller 20 generates refresh requests periodically so as to make sure that the memory array 10 is refreshed properly. Since the memory array 10 is refreshed one row of cells at a time, for a refresh time of 16 ms, the refresh controller 20 generates one refresh request every 8 µs. The refresh request signal RREQ# is activated when there is a pending refresh. The activation of the RREQ# signal is detected by the arbiter 26 at the rising-edge of the MCLK signal. If no external access request is detected, the arbiter 26 drives both the Refresh Acknowledge RFACK# and ASEL signals low for one clock cycle. The former signals that the current memory cycle is used for refresh and the later selects the Refresh address from the refresh controller 20 as the address to the memory array 10.

Figure 3:
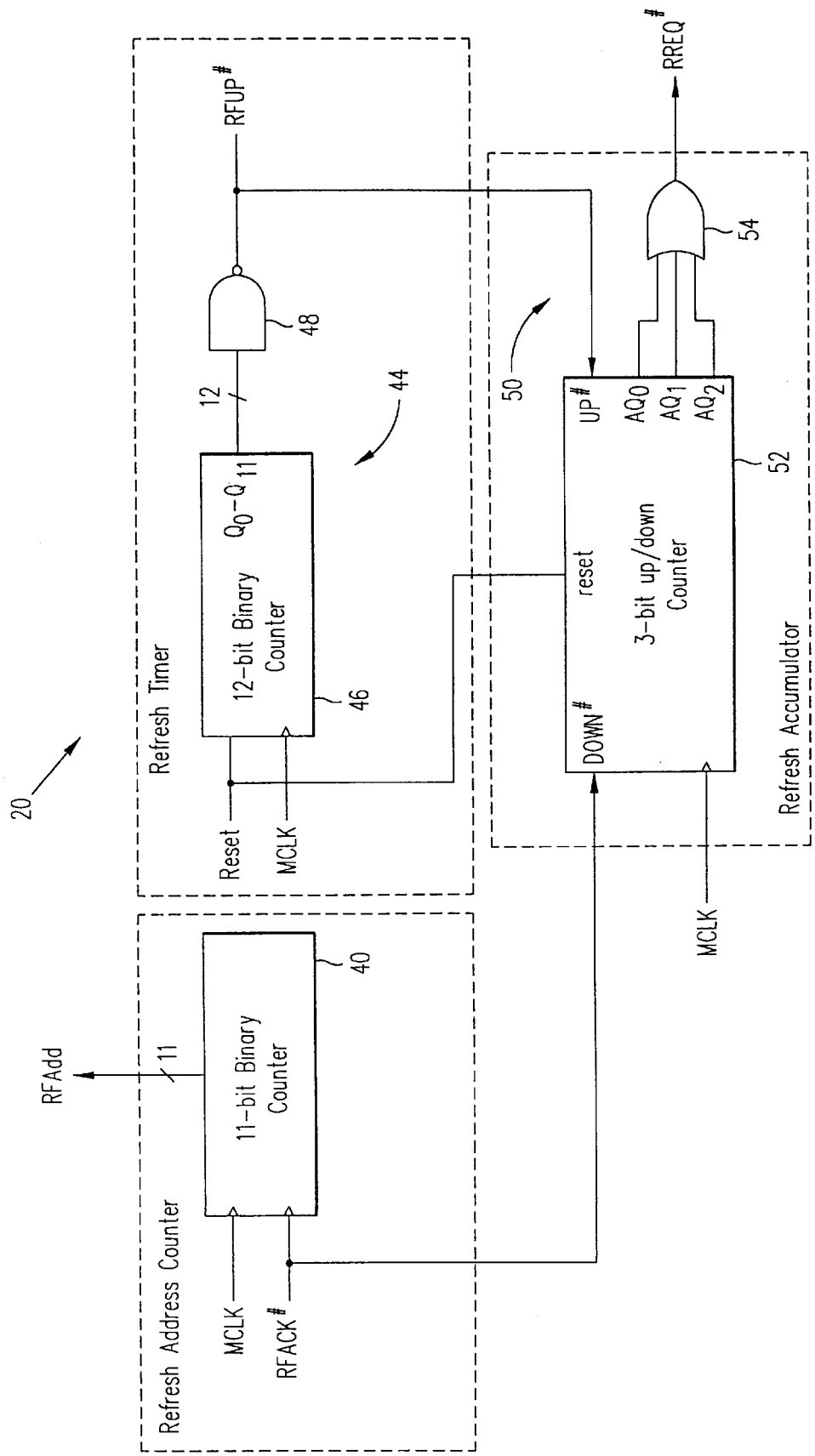
FIG. 3 shows the refresh controller of the FIG. 1 system.

FIG. 3 shows a block diagram of the refresh controller 20, which includes a refresh address counter 40, a refresh timer 44 and a refresh accumulator 50. The refresh counter 40 provides the 11-bit row address to the memory array 10 during a refresh cycle. The refresh counter 40 is incremented at the end of the refresh cycle signaled by the deactivation of the refresh acknowledge RFACK#. The refresh timer 44 is reset (by the Reset signal) at power up. Timer 44 includes 12-bit counter 46 which provides a total count of 4095 cycles and a 12-input NAND gate 48. For a clock frequency of 100 MHz, the timer 44 times up (signals Q0–Q11 are high) approximately every 8 µs.

When all the counter bits Q0–Q11 are high, the refresh up RFUP# signal is driven low by NAND gate 48 for one clock cycle. This signal is input to the refresh accumulator 50 for incrementing its 3-bit up/down counter 52. The up/down counter 52 increments by one when RFUP# is driven low and decrements by one when RFACK# is driven low for one clock cycle. The counter 52 stops incrementing when it reaches the full count, that is when AQ0–AQ2 are all high. If the accumulator 50 count is not empty, that is signals AQ0–AQ2 are not equal to 000, Refresh Request RREQ# is asserted low by OR gate 54. The function of the accumulator 50 is illustrated as follows.

There is a chance that external accesses continue for one or more refresh time-up periods (each about 8 µs). To accommodate these cases without losing refresh cycles, the refresh requests are accumulated in the accumulator 50. The refresh request RREQ# signal to the arbiter 26 will continue to be asserted low until the accumulator 50 is empty. In the present embodiment, the accumulator 50 can accumulate up to 7 refreshes. This allows the system to continue external accesses for a period of up to 56 µs without losing refresh cycles. In the computer systems that this exemplary memory system is targeted to serve, back-to-back external accesses longer than 56 µs in general do not occur. (In other applications, the counter 52 size can be increased or decreased to meet the application requirement.)

In this embodiment, the signal MCLK which synchronizes the operations of the memory system is derived conventionally from the external clock signal CLK. In another embodiment, MCLK can be generated by a conventional on-chip oscillator and PLL (phase locked loop). The PLL synchronizes the MCLK rising-edge to the output of the address transition detector which generates a pulse on the occurrence of a transition on the address bus.

FIG. 4 shows an example of internal structure of arbiter 26 of FIG. 1, including in this embodiment a NAND gate 56 coupled as shown to inverter 58; thus refresh is prevented except in the absence of a pending memory array external access.

This disclosure is illustrative and not limiting; further modifications will be apparent to one skilled in light of this disclosure, and are intended to fall within the scope of the appended claims.

I claim:

1. A method of operating a memory array including a plurality of memory cells, where the cells require periodic refreshing, comprising:

determining if an external access to the memory array is pending;

if an external access is determined to be pending, performing the external access;

determining if a refresh is pending; and performing the refresh only if no external access is determined to be pending.

2. The method of claim 1, further comprising:

accumulating any refreshes not performed while an external access is pending; and performing accumulated refreshes while no external access is determined to be pending.

3. The method of claim 1, wherein the cells each include no more than one transistor.

4. The method of claim 1, wherein the cells are each a DRAM cell.

5. The method of claim 1, wherein the memory array has a peak operating frequency at least equal to a peak frequency of the external accesses.

6. The method of claim 1, further comprising the step of operating the memory array in response to a clock signal, wherein a memory cycle time of the memory array is equal to a period of the clock signal.

7. A method of operating a memory array including a plurality of memory cells where the cells require a periodic refreshing, comprising:

determining if a refresh is pending; and only performing the pending refresh during an idle time between external accesses to the memory array.

8. A memory system comprising:

an array of memory cells, each cell requiring periodic refreshing;

an access controller coupled to the memory array for externally accessing the memory cells;

a refresh controller coupled to the memory array for refreshing the memory cells; and wherein the refresh controller only refreshes the memory cells during an idle time between external accesses to the memory cells.

9. The system of claim 8, further comprising an arbiter coupled between the access controller and the refresh controller.

10. The system of claim 8, wherein each memory cell is a DRAM cell.

11. The system of claim 8, wherein the memory cells each include no more than one transistor.

12. The system of claim 8, wherein the memory array has a peak operating frequency at least equal to a peak frequency of the external accesses.

13. The system of claim 8, further comprising an accumulator in the refresh controller for accumulating refreshes until they can be performed during the idle time.

14. The system of claim 8, wherein the memory system is operated in response to a clock signal, wherein a memory cycle time of the memory system is equal to a period of the clock signal.

15. A method of operating a memory array having a plurality of memory cells that require periodic refreshing, the method comprising the steps of:

periodically generating refresh requests;

initiating refresh cycles in response to the refresh requests only when external accesses to the memory array are not pending;

inhibiting refresh cycles in response to the refresh requests when external accesses to the memory array are pending;

accumulating refresh requests corresponding to inhibited refresh cycles; and initiating refresh cycles in response to accumulated refresh requests only when external accesses to the memory array are not pending.

* * * * *